(12) United States Patent
Lee et al.

(10) Patent No.: US 12,249,536 B2
(45) Date of Patent: Mar. 11, 2025

(54) SUBSTRATE SUPPORTING ASSEMBLY AND SUBSTRATE PROCESSING APPARATUS

(71) Applicant: WONIK IPS CO., LTD., Pyeongtaek-si (KR)

(72) Inventors: Hyun Jong Lee, Hwaseong-si (KR); Chong Hwan Jong, Anseong-si (KR); Ho Jin Nam, Suwon-si (KR); Choong hyun Lee, Hwaseong-si (KR); Eo jin Kwon, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 255 days.

(21) Appl. No.: 17/520,353

(22) Filed: Nov. 5, 2021

(65) Prior Publication Data

US 2022/0157644 A1 May 19, 2022

(30) Foreign Application Priority Data

Nov. 18, 2020 (KR) .......................... 10-2020-0154839

(51) Int. Cl.
*H01L 21/687* (2006.01)
*C23C 16/455* (2006.01)
*C23C 16/458* (2006.01)

(52) U.S. Cl.
CPC .. *H01L 21/68764* (2013.01); *C23C 16/45544* (2013.01); *C23C 16/4584* (2013.01); *C23C 16/4586* (2013.01); *H01L 21/68771* (2013.01)

(58) Field of Classification Search
CPC ......... H01L 21/68764; H01L 21/68771; C23C 16/45544; C23C 16/4584; C23C 16/4586

USPC ........................................................ 118/730
See application file for complete search history.

(56) References Cited

U.S. PATENT DOCUMENTS

| 4,860,687 | A | * | 8/1989 | Frijlink | ............... C23C 16/4584 108/138 |
| 6,797,069 | B2 | * | 9/2004 | Paisley | ............... C23C 16/4584 156/345.55 |
| 2006/0054091 | A1 | * | 3/2006 | Speciale | ........... H01L 21/68714 156/345.55 |
| 2006/0275104 | A1 | * | 12/2006 | Speciale | ................. C30B 25/12 414/935 |

(Continued)

FOREIGN PATENT DOCUMENTS

KR 1020110084644 A 7/2011
KR 1020170098704 A 8/2017

*Primary Examiner* — Charlee J. C. Bennett
(74) *Attorney, Agent, or Firm* — WILLIAM PARK & ASSOCIATES LTD.

(57) ABSTRACT

A substrate supporting assembly includes a susceptor plate including at least one substrate seat, and a plurality of gas flow lines for supplying a lifting gas, an acceleration gas, and a deceleration gas to the substrate seat, and at least one satellite on the at least one substrate seat and including an upper surface, and a lower surface where a rotation pattern for receiving a rotational force and a braking force from the acceleration gas and the deceleration gas is provided. The at least one satellite is lifted from the at least one substrate seat by the lifting gas supplied from the at least one substrate seat, is rotated relative to the susceptor plate by the acceleration gas supplied in a forward direction of rotation, to rotate the substrate, and is decelerated or stopped by the deceleration gas supplied in a reverse direction of rotation.

9 Claims, 7 Drawing Sheets

(56) References Cited

U.S. PATENT DOCUMENTS

| | | | | |
|---|---|---|---|---|
| 2007/0098904 A1* | 5/2007 | Aschner | ............... | F27D 5/0037 |
| | | | | 118/724 |
| 2008/0280453 A1* | 11/2008 | Koelmel | ........... | H01L 21/67115 |
| | | | | 438/758 |
| 2011/0303154 A1* | 12/2011 | Kim | ................. | C23C 16/45521 |
| | | | | 118/728 |
| 2012/0055405 A1* | 3/2012 | Koelmel | ............ | H01L 21/6838 |
| | | | | 118/62 |
| 2012/0288615 A1* | 11/2012 | Jung | ................ | C23C 16/45572 |
| | | | | 427/9 |
| 2013/0224962 A1* | 8/2013 | Koelmel | ................ | C23C 16/52 |
| | | | | 438/746 |
| 2017/0241018 A1* | 8/2017 | Oyama | ................ | C23C 16/455 |

* cited by examiner

SUBSTRATE SUPPORTING ASSEMBLY AND SUBSTRATE PROCESSING APPARATUS

CROSS-REFERENCE TO RELATED PATENT APPLICATION

This application claims the benefit of Korean Patent Application No. 10-2020-0154839, filed on Nov. 18, 2020, in the Korean Intellectual Property Office, the disclosure of which is incorporated herein in its entirety by reference.

BACKGROUND

1. Field

The present invention relates to a semiconductor apparatus for processing substrates and, more particularly, to a substrate supporting assembly and a substrate processing apparatus.

2. Description of the Related Art

In general, to manufacture semiconductor devices, display devices, or solar cells, various processes are performed in a substrate processing apparatus including a process chamber in a vacuum atmosphere. For example, a substrate may be loaded in the process chamber and a process for depositing a thin film on the substrate or etching the thin film may be performed. The substrate may be supported by a substrate supporting assembly mounted in the process chamber, and a process gas may be injected onto the substrate through a gas injector mounted to face the substrate supporting assembly.

In the above-described substrate processing apparatus, the substrate needs to rotate to be uniformly processed. Uniform processing of the substrate may be achieved by rotating the substrate while being exposed to the process gas. To rotate the substrate, the substrate supporting assembly uses a technology for rotating the substrate in a lifted state by using a satellite.

SUMMARY

In the above-described substrate supporting assembly, even after supply of an acceleration gas is stopped, a considerable amount of time is taken until the substrate is stopped. As such, fast deceleration of rotation of the satellite is required.

The present invention provides a substrate supporting assembly and substrate processing apparatus capable of controlling a speed of rotating and stopping a substrate. However, the scope of the present invention is not limited thereto.

According to an aspect of the present invention, there is provided a substrate supporting assembly including a susceptor plate including at least one substrate seat where a substrate is seated, and a plurality of gas flow lines for supplying a lifting gas, an acceleration gas, and a deceleration gas to the substrate seat, and at least one satellite provided on the at least one substrate seat and including an upper surface where the substrate is seated, and a lower surface where a rotation pattern for receiving a rotational force and a braking force from the acceleration gas and the deceleration gas is provided, wherein the at least one satellite is lifted from the at least one substrate seat by the lifting gas supplied from the at least one substrate seat, is rotated relative to the susceptor plate by the acceleration gas supplied in a forward direction of rotation, to rotate the substrate, and is decelerated or stopped by the deceleration gas supplied in a reverse direction of rotation.

At least one gas distribution plate for distributing the lifting gas, the acceleration gas, and the deceleration gas supplied from the at least one substrate seat, and supplying the distributed gases to the at least one satellite may be coupled onto the at least one substrate seat, and the at least one gas distribution plate may include a lifting gas hole for supplying the lifting gas, at least one acceleration gas hole inclined in the forward direction of rotation to provide the acceleration gas, and at least one deceleration gas hole inclined in the reverse direction of rotation to provide the deceleration gas.

The at least one substrate seat may include a plurality of substrate seats provided along a circumferential direction of the susceptor plate, and the plurality of gas flow lines may include a plurality of lifting gas flow lines connected separately to the plurality of substrate seats, a plurality of acceleration gas flow lines connected separately to the plurality of substrate seats, and a plurality of deceleration gas flow lines connected separately to the plurality of substrate seats.

The substrate supporting assembly may further include a shaft coupled to the susceptor plate and being rotatable to make the substrate revolve, and the shaft may include a plurality of gas supply lines through which the lifting gas, the acceleration gas, and the deceleration gas move.

The plurality of gas supply lines may include a first gas supply line connected commonly to the plurality of lifting gas flow lines, a second gas supply line connected commonly to the plurality of deceleration gas flow lines, and a plurality of third gas supply lines connected separately to the plurality of acceleration gas flow lines.

The at least one satellite may include a power transmission pattern provided along a rotation line on the lower surface of the at least one satellite to receive the rotational force and the braking force from the acceleration gas and the deceleration gas.

The power transmission pattern may include a plurality of grooves provided at an edge of the lower surface of the at least one satellite.

A position fixing knob may be provided on the susceptor plate at a center of the substrate seat, and a knob groove into which at least a portion of the position fixing knob is inserted may be provided in the lower surface of the satellite.

According to another aspect of the present invention, there is provided a substrate processing apparatus including a process chamber, the above-described substrate supporting assembly mounted in the process chamber, and a gas injector mounted on the process chamber to face the substrate supporting assembly and inject a process gas toward the substrate supporting assembly.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
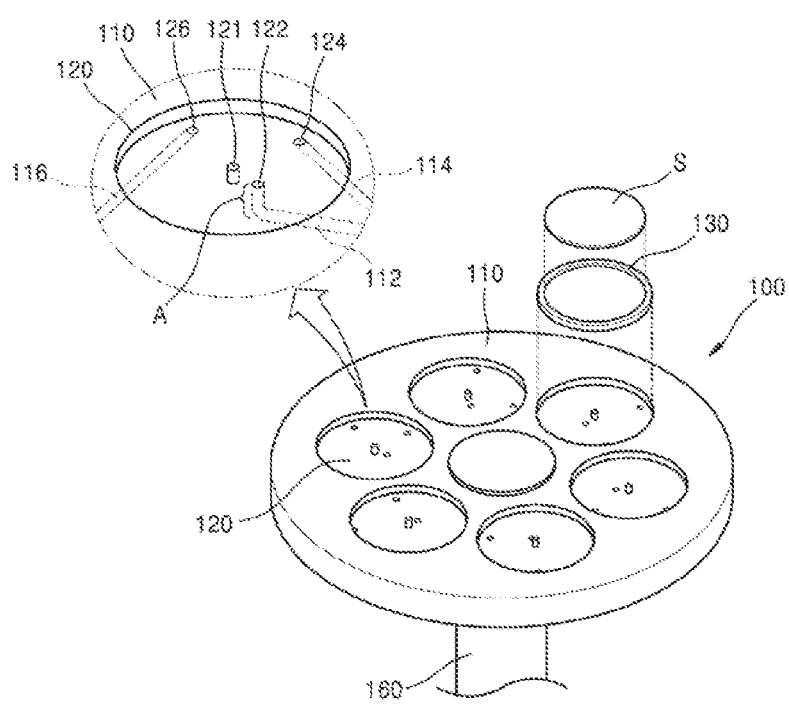
FIG. 1 is a perspective view of a substrate supporting assembly according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein: rather, these embodiments are provided so that this disclosure will be thorough and complete, and will fully convey the concept of the invention to one of ordinary skill in the art. In the drawings, the thicknesses or sizes of layers are exaggerated for clarity and convenience of explanation.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIG. 1 is a perspective view of a substrate supporting assembly 100 according to an embodiment of the present invention.

Referring to FIG. 1, the substrate supporting assembly 100 may include a susceptor plate 110 and a satellite 130.

The susceptor plate 110 may include at least one substrate seat 120 where a substrate S is seated. For example, the substrate seat 120 may be provided on the susceptor plate 110 in a pocket groove shape. To simultaneously process a plurality of substrates 5, a plurality of substrate seats 120 may be provided. For example, the plurality of substrate seats 120 may be provided on an upper surface of the susceptor plate 110 along a circumferential direction and be spaced apart from each other by a certain distance. Specifically, the substrate seats 120 may be provided at equal angles in radial directions from a rotation axis of the susceptor plate 110.

The susceptor plate 110 may include a plurality of gas flow lines 112, 114, and 116 connected to the substrate seat 120. For example, certain working gases, e.g., lifting gas for lifting the substrate 5, an acceleration gas for rotating the substrate S, and/or a deceleration gas for decelerating or stopping the substrate S, may be supplied through the gas flow lines 112, 114, and 116 to the substrate seat 120. The lifting gas, the acceleration gas, and the deceleration gas may be supplied separately through the gas flow lines 112, 114, and 116 and through the substrate seat 120 to the satellite 130.

For example, the gas flow lines 112, 114, and 116 may include a plurality of lifting gas flow lines 112, a plurality of acceleration gas flow lines 114, and a plurality of deceleration gas flow lines 116. The lifting gas flow lines 112 may supply the lifting gas to the substrate seats 120, the acceleration gas flow lines 114 may supply the acceleration gas to the substrate seats 120, and the deceleration gas flow lines 116 may supply the deceleration gas to the substrate seats 120.

Specifically, the lifting gas flow lines 112 may be connected separately to the substrate seats 120, the acceleration gas flow lines 114 may be connected separately to the substrate seats 120, and the deceleration gas flow lines 116 may be connected separately to the substrate seats 120.

Each substrate seat 120 may include a first injection hole 122 connected to the lifting gas flow line 112, a second injection hole 124 connected to the acceleration gas flow line 114, and a third injection hole 126 connected to the deceleration gas flow line 116. For example, at least a discharge portion A of the first injection hole 122 may extend in a direction perpendicular to the substrate seat 120 to supply the lifting gas vertically upward. Furthermore, the second injection hole 124 may be inclined to supply the acceleration gas in a forward direction of rotation, and the third injection hole 126 may be inclined to supply the deceleration gas.

At least one satellite 130 may be provided on the substrate seat 120. The substrate S may be seated on an upper surface of the satellite 130. For example, a plurality of satellites 130 may be provided separately on a plurality of substrate seats 120 and, in this case, the number of satellites 130 may be the same as the number of substrate seats 120.

The satellite 130 may be supplied with the lifting gas from the substrate seat 120 and be lifted from the substrate seat 120. Furthermore, the satellite 130 may be rotated relative to the susceptor plate 110 by the acceleration gas supplied from the substrate seat 120 in the forward direction of rotation, to rotate the substrate S relative to the susceptor plate 110. This circular motion is made relative to the susceptor plate 110, and thus may be called rotation. Besides, the satellite 130 may be decelerated or stopped by the deceleration gas supplied from the substrate seat 120 in the reverse direction of rotation.

For example, the forward direction of rotation may refer to a direction where the satellite 130 rotates, and the reverse direction of rotation may refer to a direction opposite to the forward direction of rotation to decelerate the rotating satellite 130. Specifically, the forward and reverse directions of rotation may be opposite directions along a tangent on the circumference based on a position of the satellite 130.

Figure 6:
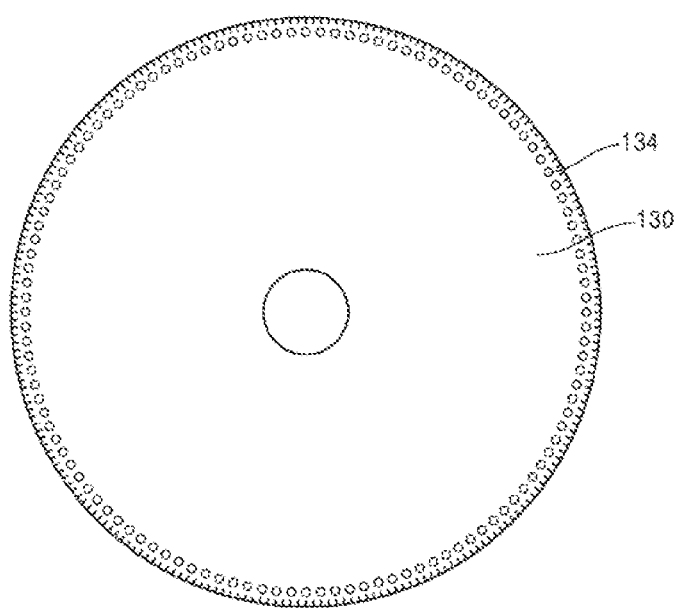
FIG. 6 is a bottom view of a satellite of substrate supporting assemblies according to embodiments of the present invention.

In some embodiments, as illustrated in FIG. 6, the satellite 130 may include a power transmission pattern 134 on a lower surface thereof to easily receive a rotational force and a braking force from the supplied acceleration and deceleration gases. For example, the power transmission pattern 134 may be provided as a plurality of grooves along the circumference at the edge of the lower surface of the satellite 130. Specifically, the power transmission pattern 134 may be provided as a symmetric groove pattern, e.g., a circular groove pattern, to receive the rotational force and the braking force from the acceleration gas and the deceleration gas supplied from different directions.

Furthermore, a position fixing knob 121 may be provided on the susceptor plate 110 at the center of the substrate seat 120, and a knob groove (not shown) into which at least a portion of the position fixing knob 121 is inserted may be provided in the lower surface of the satellite 130. As such, the position of the satellite 130 may be guided by the position fixing knob 121, and the satellite 130 may stably rotate.

Additionally, a shaft 160 may be coupled to the susceptor plate 110. The shaft 160 may rotate to make the substrate S revolve. For example, an actuator (not shown) may be coupled to the shaft 160, and the shaft 160 may be rotated or vertically moved by the actuator. When the shaft 160 rotates or vertically moves, the susceptor plate 110 may also rotate or vertically move.

The structure of the shaft 160 will now be described in detail.

Figure 7:
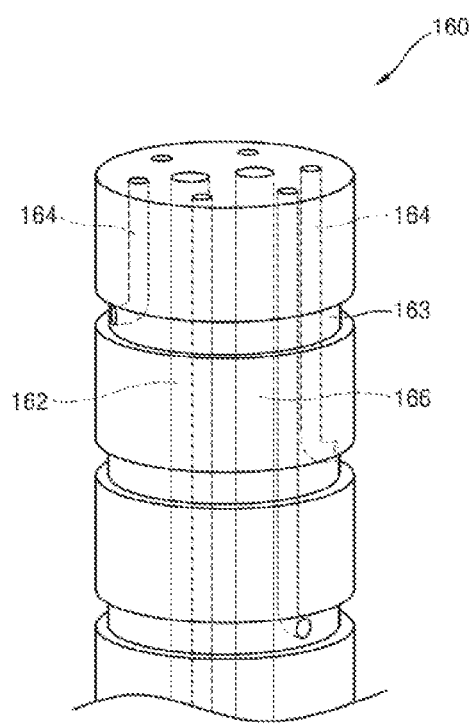
FIG. 7 is a perspective view of a shaft of substrate supporting assemblies according to embodiments of the present invention.

FIG. 7 is a perspective view of the shaft 160 of substrate supporting assemblies according to embodiments of the present invention.

Referring to FIGS. 1 and 7, the shaft 160 may include a plurality of gas supply lines 162, 164, and 166 through which the lifting gas, the acceleration gas, and the deceleration gas move. For example, the gas supply lines 162, 164, and 166 may include a first gas supply line 162 connected commonly to the lifting gas flow lines 112, a second gas supply line 166 connected commonly to the deceleration gas flow lines 116, and a plurality of third gas supply lines 164 connected separately to the acceleration gas flow lines 114.

Specifically, the first gas supply line 162 may penetrate from a lower surface to an upper surface of the shaft 160 and be connected commonly to the lifting gas flow lines 112, the second gas supply line 166 may penetrate from the lower surface to the upper surface of the shaft 160 and be connected commonly to the deceleration gas flow lines 116, and the third gas supply lines 164 may penetrate from a side wall to the upper surface of the shaft 160 and be connected separately to the acceleration gas flow lines 114.

For example, each of the first gas supply line 162 for supplying the lifting gas and the second gas supply line 166 for supplying the deceleration gas may be a single line connected commonly to the plurality of substrate seats 120, and thus may extend in a line along an axis of the shaft 160.

The third gas supply lines 164 for supplying the acceleration gas may be connected separately to the substrate seats 120, and thus the number of third gas supply lines 164 may be the same as the number of substrate seats 120. As such, the third gas supply lines 164 may extend from different locations on the side wall of the shaft 160 to the upper surface of the shaft 160.

Specifically, a plurality of ring grooves 163 may be provided in the side wall of the shaft 160, and the third gas supply lines 164 may extend from the ring grooves 163 to the upper surface of the shaft 160. The acceleration gas may be supplied to the ring grooves 163, and then supplied through the third gas supply lines 164 to the acceleration gas flow lines 114. The ring grooves 163 may be sealed with a magnetic fluid, and thus the acceleration gas may be supplied to the third gas supply lines 164 in the sealed state even when the shaft 160 rotates.

Meanwhile, in a modified example of the current embodiment, the first gas supply line 162 for supplying the lifting gas or the second gas supply line 166 for supplying the deceleration gas may be provided as a plurality of lines connected separately to the substrate seats 120.

In another modified example of the current embodiment, the third gas supply lines 164 may penetrate from the lower surface to the upper surface of the shaft 160.

Figure 2:
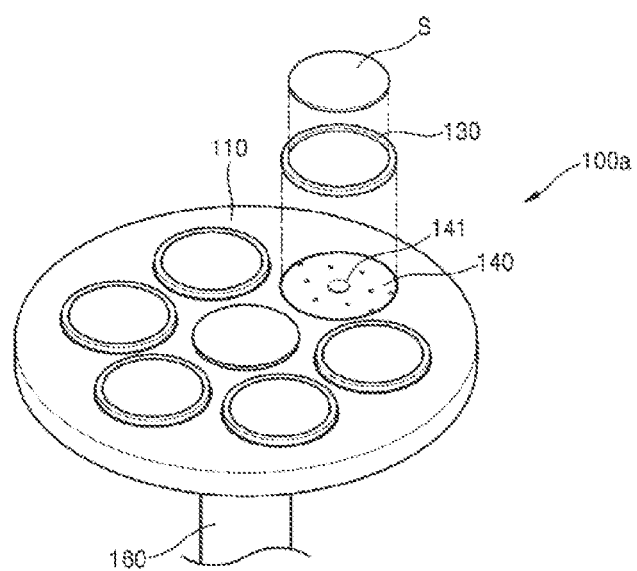
FIG. 2 is a perspective view of a substrate supporting assembly according to another embodiment of the present invention.
Figure 3:
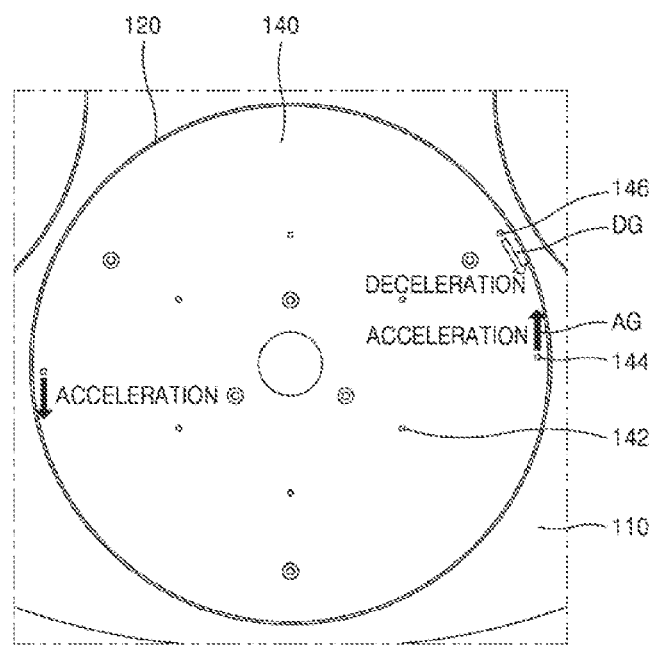
FIG. 3 is a partial plan view showing one substrate seat of the substrate supporting assembly of FIG. 2.
Figure 4:
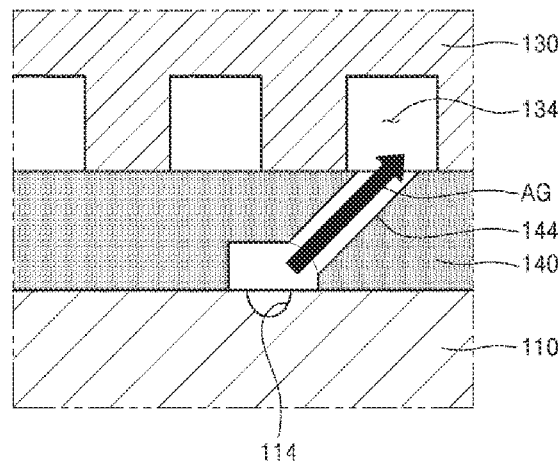
FIG. 4 is a partial cross-sectional view showing supply of an acceleration gas from the substrate seat of FIG. 3.
Figure 5:
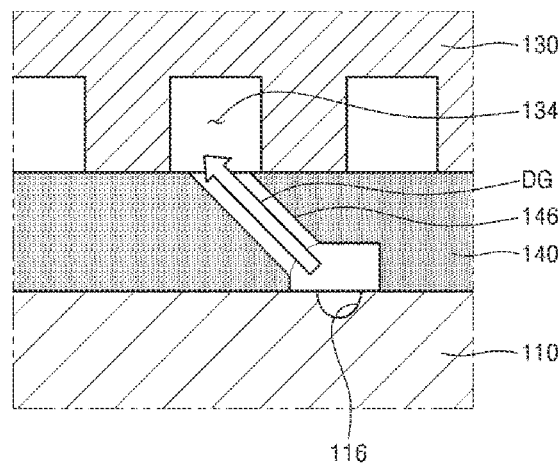
FIG. 5 is a partial cross-sectional view showing supply of a deceleration gas from the substrate seat of FIG. 3.

FIG. 2 is a perspective view of a substrate supporting assembly 100a according to another embodiment of the present invention, FIG. 3 is a partial plan view showing one substrate seat 120 of the substrate supporting assembly 100a of FIG. 2, FIG. 4 is a partial cross-sectional view showing supply of the acceleration gas from the substrate seat 120 of FIG. 3, and FIG. 5 is a partial cross-sectional view showing supply of the deceleration gas from the substrate seat 120 of FIG. 3. The substrate supporting assembly 100a according to the current embodiment is produced by adding some elements to or modifying some elements of the substrate supporting assembly 100 of FIG. 1, configurations thereof may correspond to each other, and thus repeated descriptions between the embodiments are not provided herein.

Referring to FIGS. 2 to 5, the substrate supporting assembly 100a may include at least one gas distribution plate 140. The gas distribution plate 140 may distribute a lifting gas, an acceleration gas, and a deceleration gas and supply the distributed gases to the satellite 130. For example, the gas distribution plate 140 may be coupled onto the substrate seat 120, and be fastened onto the substrate seat 120 by using a fixing device such as a screw. Specifically, a plurality of gas distribution plates 140 may be coupled separately to the substrate seats 120.

Furthermore, the gas distribution plate 140 may be provided between the substrate seat 120 and the satellite 130. For example, the gas distribution plate 140 may be fixed onto the substrate seat 120, and the satellite 130 may be seated on the gas distribution plate 140.

The gas distribution plate 140 may include at least one lifting gas hole 142 for supplying the lifting gas, at least one acceleration gas hole 144 inclined in a forward direction of rotation to supply the acceleration gas, and at least one deceleration gas hole 146 inclined in a reverse direction of rotation to supply the deceleration gas. A plurality of lifting gas holes 142 may be provided along a circumferential direction of the satellite 130 to lift the satellite 130 in balance. One or more acceleration gas holes 144 and one or more deceleration gas holes 146 may be provided.

The acceleration gas may be provided in a direction for accelerating the satellite 130, and the deceleration gas may be provided in a direction for decelerating the satellite 130. The acceleration gas may collide with a &de of the power transmission pattern 134 on a lower surface of the satellite 130 to rotate the satellite 130 in one direction, and the deceleration gas may collide with the other side of the power transmission pattern 134 on the lower surface of the satellite 130 to decelerate the satellite 130. An arrow AG in FIG. 4 may indicate a direction in which the acceleration gas is discharged, and an arrow DG in FIG. 5 may indicate a direction in which the deceleration gas is discharged.

Distribution channels for distributing the lifting gas, the acceleration gas, and the deceleration gas may be provided on a lower surface of the gas distribution plate 140. Ends of the distribution channels may be connected to the gas flow lines 112, 114, and 116 of the substrate seat 120 to receive the lifting gas, the acceleration gas, and the deceleration gas, and the other ends thereof may be connected separately to the lifting gas holes 142, the acceleration gas hole 144, and the deceleration gas hole 146 to discharge the lifting gas, the acceleration gas, and the deceleration gas toward the satellite 130.

According to the substrate supporting assembly 100a, the lifting gas hole 142, the acceleration gas hole 144, and the deceleration gas hole 146 may be provided with directivity in the gas distribution plate 140, and thus the structure of the gas flow lines 112, 114, and 116 in the susceptor plate 110 may be simplified.

Figure 8:
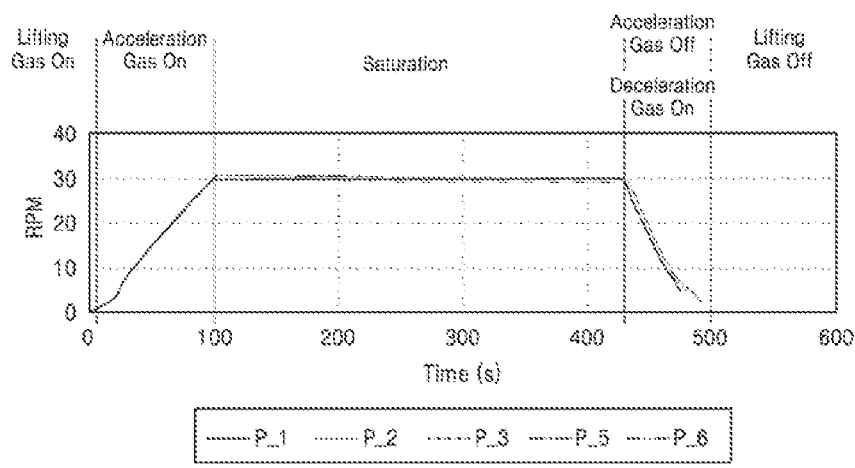
FIG. 8 is a graph showing operating characteristics of substrate supporting assemblies according to embodiments of the present invention.

FIG. 8 is a graph showing operating characteristics of the substrate supporting assemblies 100 and 100a according to embodiments of the present invention.

Referring to FIG. 8, it is shown that, when a lifting gas is supplied (lifting gas on) and then an acceleration gas is supplied (acceleration gas on), the satellite 130 is accelerated and thus a rotation speed thereof is saturated (saturation) and, when a process is terminated and then the supply of the acceleration gas is stopped (acceleration gas off) and a deceleration gas is supplied (deceleration gas on), the satellite 130 is decelerated and stopped within a short time. Although it generally takes more than 200 seconds to stop the satellite 130 without the deceleration gas, when the deceleration gas is supplied as described above, the satellite 130 may be stopped within 100 seconds.

Therefore, using the substrate supporting assemblies 100 and 100a according to embodiments of the present invention, a process time may be reduced due to fast braking and thus productivity for substrate processing may be increased. Furthermore, when a rotation speed of the satellite 130 and the substrate S is excessively high, the deceleration gas may be used to reduce the rotation speed to a normal speed.

Besides, in the substrate supporting assemblies 100 and 100a, because the satellite 130 is decelerated by using the deceleration gas and the lifting gas is usable only to lift the satellite 130, compared to a case when the lifting gas is used for deceleration, the satellite 130 and the substrate S may be stably maintained in a lifted state and thus be less shaken during a process.

Figure 9:
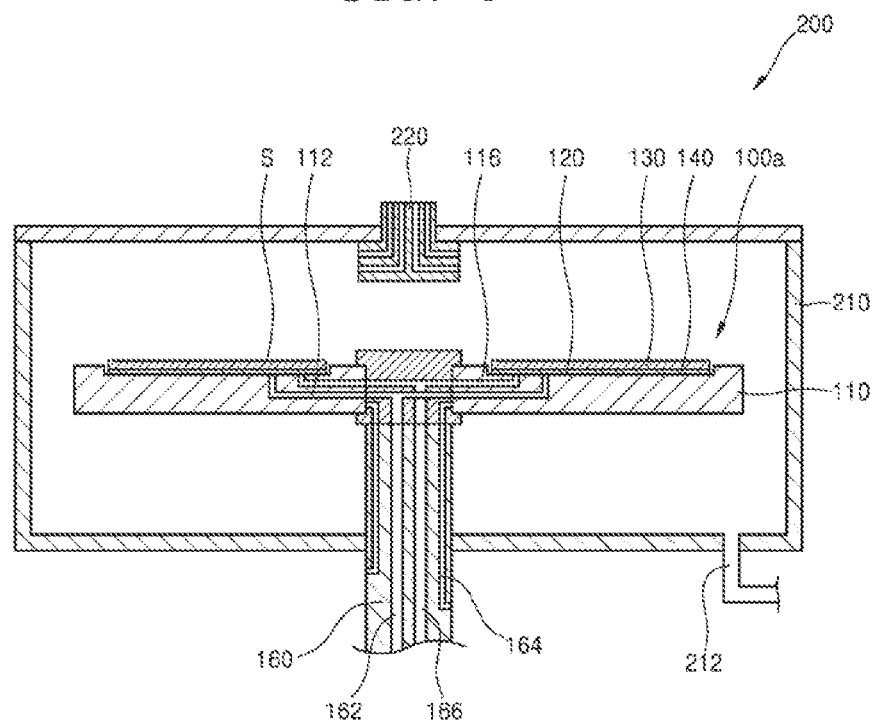
FIG. 9 is a cross-sectional view of a substrate processing apparatus according to an embodiment of the present invention.

FIG. 9 is a cross-sectional view of a substrate processing apparatus 200 according to an embodiment of the present invention.

Referring to FIG. 9, the substrate processing apparatus 200 may include a process chamber 210, the substrate supporting assembly 100a, and a gas injector 220.

The process chamber 210 may define a process space for processing the substrate S. For example, the process chamber 210 may be configured to maintain airtightness, and be connected through at least one exhaust port 212 to a vacuum pump (not shown) to discharge a process gas in the process space and adjust a vacuum level in the process space.

The process chamber 210 may be provided in various shapes and include, for example, a side wall for defining the process space and a cover located on the top of the side wall. Furthermore, the process chamber 210 may include, on the side wall, a gate (not shown) to be open to move the substrate S therethrough.

The substrate supporting assembly 100a may be elevatably and/or rotatably mounted in the process chamber 210. For example, the substrate supporting assembly 100a may be coupled to the process chamber 210 by using a bellows structure (not shown) to maintain airtightness of the process chamber 210 when the shaft 160 is elevated and/or rotated.

The gas injector 220 may be mounted on the process chamber 210 to supply a process gas supplied from outside the process chamber 210, into the process space in the process chamber 210. For example, the gas injector 220 may be mounted on the process chamber 210 to face the substrate supporting assembly 100a and inject the process gas toward the substrate supporting assembly 100a. Specifically, the gas injector 220 may be mounted on the top of the process chamber 210 to face the susceptor plate 110 and inject the process gas toward the substrate S seated on the substrate supporting assembly 100a.

The gas injector 220 may include at least one inlet hole provided on the top or at a side to receive the process gas supplied from outside, and a plurality of injection holes provided downward to face the substrate S and inject the process gas onto the substrate S. For example, the gas injector 220 may have various forms, e.g., a form of a shower head or a nozzle.

In a modified example of the current embodiment, in the substrate processing apparatus 200, the substrate supporting assembly 100a may be replaced by the substrate supporting assembly 100 of FIG. 1.

The substrate processing apparatus 200 may be used as a thin film deposition device for depositing a thin film on the substrate S. For example, the substrate processing apparatus 200 may be used for a thin film deposition device using chemical vapor deposition (CVD) or atomic layer deposition (ALD).

Based on the substrate supporting assembly and the substrate processing apparatus according to the afore-described embodiments of the present invention, a braking force to stop rotation of a substrate may be improved and thus productivity may be increased.

However, the scope of the present invention is not limited to the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A substrate supporting assembly comprising:
    a susceptor plate comprising at least one substrate seat where a substrate is seated, and a plurality of gas flow lines that supply a lifting gas, an acceleration gas, and a deceleration gas to the substrate seat; and
    at least one satellite disposed on the at least one substrate seat and comprising an upper surface where the substrate is seated and a lower surface including a power transmission pattern that receives a rotational force and a braking force from the acceleration gas and the deceleration gas, respectively;
    wherein the at least one satellite is lifted from the at least one substrate seat by the lifting gas supplied from the at least one substrate seat, is rotated relative to the susceptor plate when the acceleration gas supplied in a forward direction of rotation collides with one side of the power transmission pattern and is decelerated or stopped when the deceleration gas supplied in a reverse direction of rotation collides with the other side of the power transmission pattern; and
    wherein the power transmission pattern comprises a plurality of symmetric grooves disposed at an edge of the lower surface of the at least one satellite, wherein each of the plurality of symmetric grooves has a first side and a second side opposite to the first side such that the first side receives the rotational force from the acceleration gas and the second side receives the braking force from the deceleration gas.

2. The substrate supporting assembly of claim 1, wherein at least one gas distribution plate for distributing the lifting gas, the acceleration gas, and the deceleration gas supplied from the at least one substrate seat, and supplying the distributed gases to the at least one satellite is coupled onto the at least one substrate seat, and
    wherein the at least one gas distribution plate comprises a lifting gas hole for supplying the lifting gas, at least one acceleration gas hole inclined in the forward direction of rotation to provide the acceleration gas, and at least one deceleration gas hole inclined in the reverse direction of rotation to provide the deceleration gas.

3. The substrate supporting assembly of claim 1, wherein the at least one substrate seat comprises a plurality of substrate seats provided along a circumferential direction of the susceptor plate, and
wherein the plurality of gas flow lines comprise a plurality of lifting gas flow lines connected separately to the plurality of substrate seats, a plurality of acceleration gas flow lines connected separately to the plurality of substrate seats, and a plurality of deceleration gas flow lines connected separately to the plurality of substrate seats.

4. The substrate supporting assembly of claim 3, further comprising a shaft coupled to the susceptor plate and being rotatable to make the substrate revolve, wherein the shaft comprises a plurality of gas supply lines through which the lifting gas, the acceleration gas, and the deceleration gas move.

5. The substrate supporting assembly of claim 4, wherein the plurality of gas supply lines comprise a first gas supply line connected commonly to the plurality of lifting gas flow lines, a second gas supply line connected commonly to the plurality of deceleration gas flow lines, and a plurality of third gas supply lines connected separately to the plurality of acceleration gas flow lines.

6. The substrate supporting assembly of claim 1, wherein a position fixing knob is provided on the susceptor plate at a center of the substrate seat, and
wherein a knob groove into which at least a portion of the position fixing knob is inserted is provided in the lower surface of the satellite.

7. A substrate processing apparatus comprising:
a process chamber;
the substrate supporting assembly of claim 1, which is mounted in the process chamber; and
a gas injector mounted on the process chamber to face the substrate supporting assembly and inject a process gas toward the substrate supporting assembly.

8. The substrate supporting assembly of claim 1, wherein the acceleration gas is supplied along a first inclined direction and the deceleration gas is supplied along a second inclined direction.

9. A substrate supporting assembly comprising:
a susceptor plate comprising at least one substrate seat where a substrate is seated, and a plurality of gas flow lines that supply a lifting gas, an acceleration gas, and a deceleration gas to the substrate seat; and
at least one satellite disposed on the at least one substrate seat and comprising an upper surface where the substrate is seated and a lower surface including a power transmission pattern that receives a rotational force and a braking force from the acceleration gas and the deceleration gas, respectively;
wherein the at least one satellite is lifted from the at least one substrate seat by the lifting gas supplied from the at least one substrate seat, is rotated relative to the susceptor plate when the acceleration gas supplied in a forward direction of rotation collides with one side of the power transmission pattern and is decelerated or stopped when the deceleration gas supplied in a reverse direction of rotation collides with the other side of the power transmission pattern; and
wherein the power transmission pattern comprises a plurality of symmetric grooves disposed at an edge of the lower surface of the at least one satellite, wherein each of the plurality of symmetric grooves has a first side and a second side opposite to the first side such that the first side receives the rotational force from the acceleration gas and the second side receives the braking force from the deceleration gas, and wherein the plurality of grooves is spaced evenly along the circumference of the lower surface of the satellite.

* * * * *